United States Patent [19]

Stoffel

[11] 4,328,425
[45] May 4, 1982

[54] FILTER FOR IMAGE PIXELS

[75] Inventor: James C. Stoffel, Rochester, N.Y.

[73] Assignee: Xerox Corporation, Stamford, Conn.

[21] Appl. No.: 174,778

[22] Filed: Aug. 4, 1980

[51] Int. Cl.³ .......................................... H01J 40/14
[52] U.S. Cl. .................................. 250/578; 250/211 J
[58] Field of Search ............... 250/578, 211 J; 357/24, 357/31, 32; 307/221 D

[56] References Cited

U.S. PATENT DOCUMENTS

| | | | |
|---|---|---|---|
| 3,997,911 | 12/1976 | Perriman et al. | 358/75 |
| 4,032,978 | 6/1980 | Wong | 358/283 |
| 4,040,094 | 8/1977 | Everett et al. | 358/283 |
| 4,084,196 | 4/1978 | Tisue et al. | 358/283 |

OTHER PUBLICATIONS

Digital Image Processing, William K. Pratt, pp. 201–205 and 266–271, 1978.

Primary Examiner—David C. Nelms
Assistant Examiner—Darwin R. Hostetter
Attorney, Agent, or Firm—Frederick E. McMullen

[57] ABSTRACT

A separable two dimensional Finite Impulse Response (FIR) digital image processing filter with X-dimension filter section having a delay buffer series to which digitized image signals or pixels are first input. The buffer inputs and output are tapped and pixels tapped off are processed by preset multiplier factors and input to an adder where the processed pixels are summed. The summed pixels are fed to a line buffer series of a Y-dimension filter section, tapped off from the filter inputs and output, and processed by further preset multiplier factors. The processed pixels are input to a second adder and summed to provide filtered output pixels.

In a second embodiment, the filter is symmetric and has a center point response of unity. In a third embodiment, the filter X and Y dimension filter sections are reversed.

4 Claims, 4 Drawing Figures

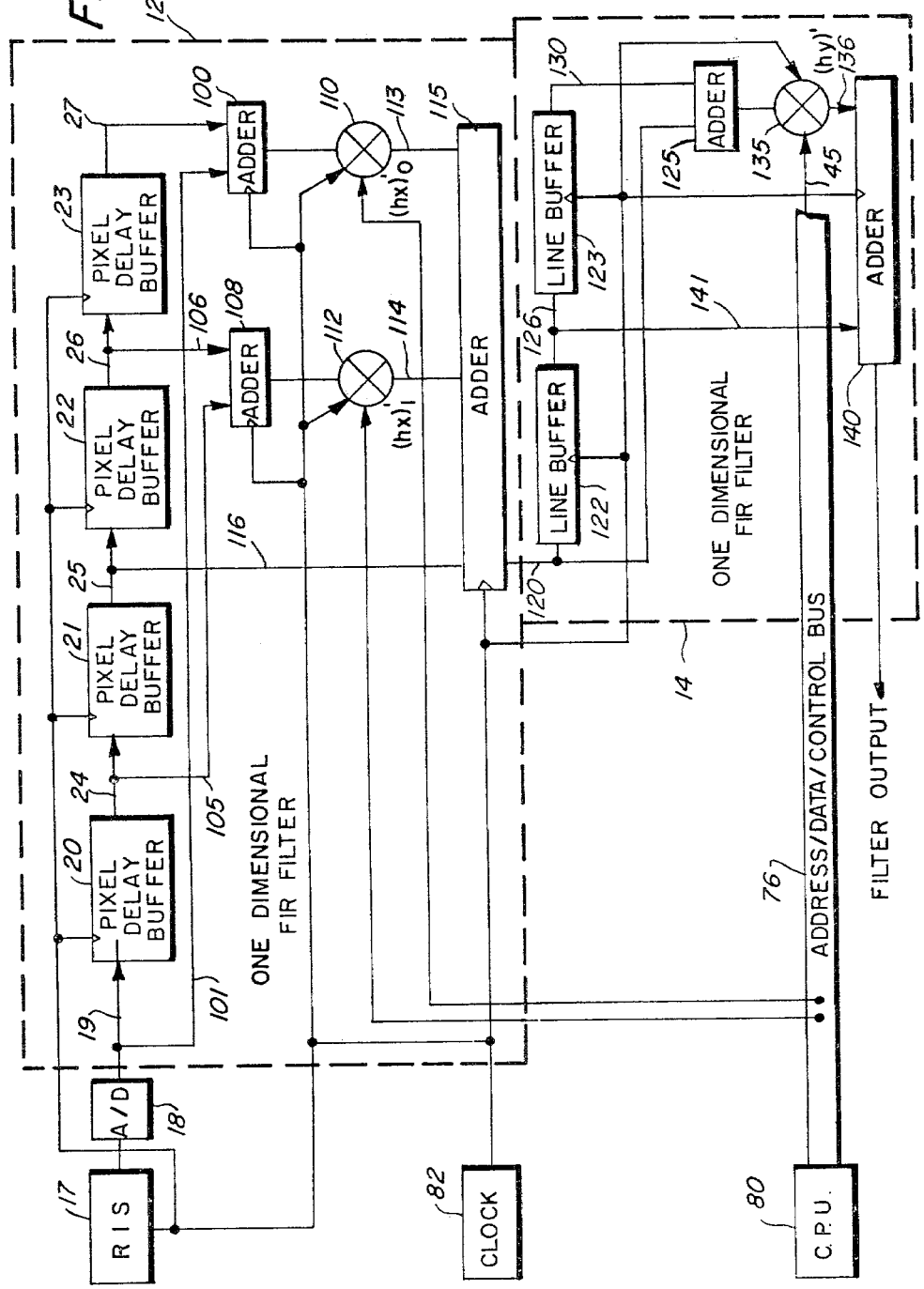

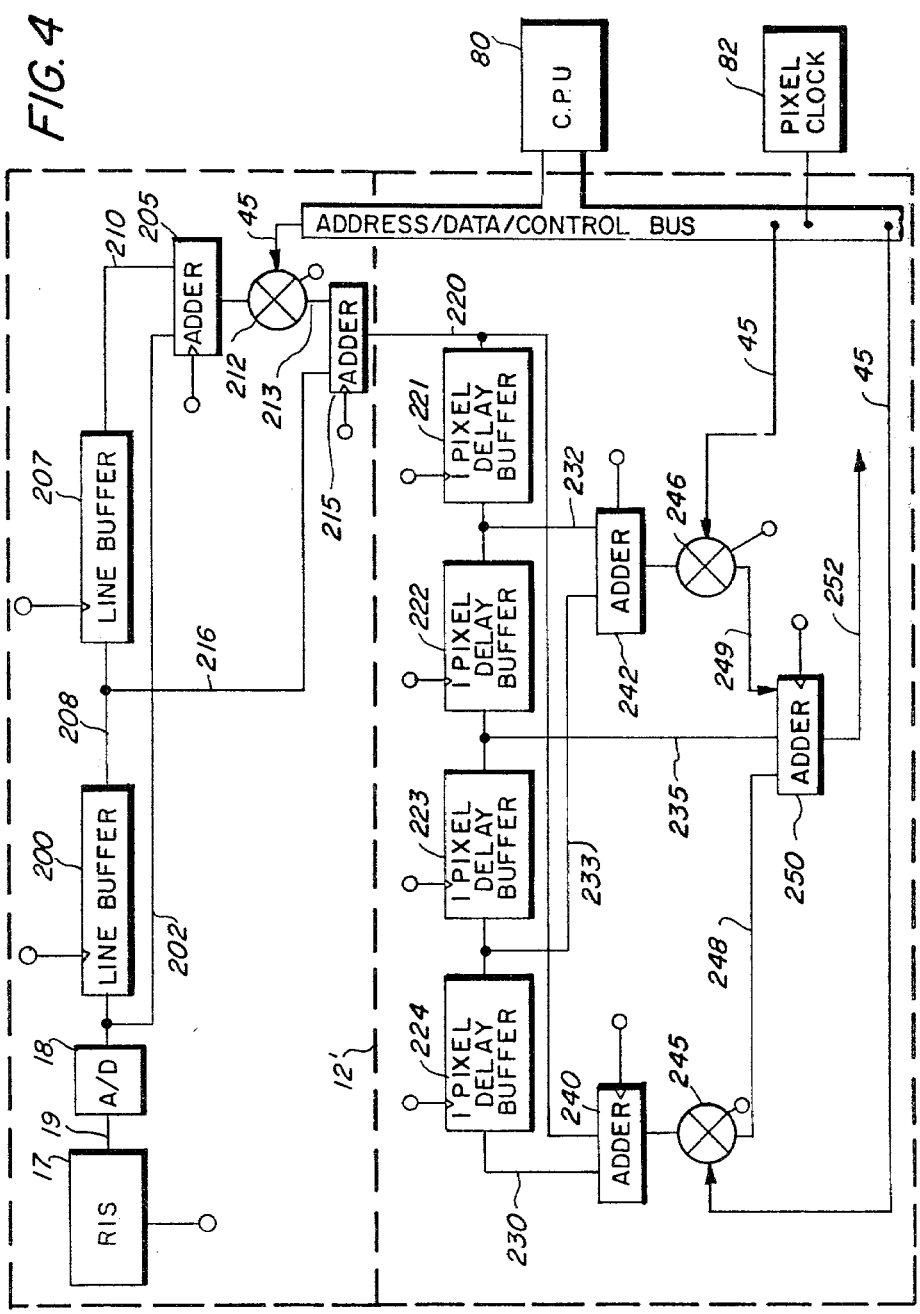

FILTER FOR IMAGE PIXELS

This invention relates to image processing filters, and more particularly to a two-dimensional, separable finite impulse response filter requiring reduced arithmetic operations.

In the ensuing description M is used to refer to image scan lines along the Y-axis while N is used to refer to image signal or pixel position along the X-axis as may be seen in FIG. 1 of the drawings. For digital image processing applications, the darkness of each cell or pixel shown is typically represented by a six to eight bit digital value.

Analog image signals derived from a suitable source, such as a raster input scanner of the type shown and disclosed by U.S. Pat. No. 4,122,352 to Peter A. Crean et al, issued on Oct. 24, 1978, may be processed by means of an electronic filter to provide digital (i.e. binary "1" or "0") image signals or pixels. The filtered image pixels may thereafter be used, for example, to create latent electrostatic images as by raster scanning a charged xerographic plate with a flying spot beam modulated in accordance with the filtered image pixels. The latent electrostatic images may, thereafter, be developed and transferred to a copy substrate material using known xerographic techniques.

A general discrete two-dimentional filter convolution may be expressed by the following relationship:

$$g_{mn} = p_{mn} * h_{mn}, \tag{1}$$

where:

$p_{mn}$ = value of input pixel in cell (m,n);
$h_{mn}$ = filter unit pulse response (point spread function); and
$g_{mn}$ = value of filtered output pixel.

$$g_{mn} = \sum_{k=-\infty}^{\infty} \sum_{r=-\infty}^{\infty} P_{kr} h_{m-k, n-r} \tag{2}$$

As a practical example, let the origin of the image be defined such that cell (0,0) corresponds to the upper left corner and assume a 3 point by 5 point Finite Impulse Response Filter, whose response $h_{mn}$ outside the range [0 m 2, 0 n 4] is zero. Then the limits of equation (2) can be truncated accordingly giving:

$$g_{mn} = \sum_{k=m-2}^{m} \sum_{r=m-4}^{n} P_{kr} h_{m-k, n-r} \tag{3}$$

For a specific case, the jittered output pixel at cell (6,6) would be given by:

$$g_{66} = \sum_{k=4}^{6} \sum_{r=2}^{6} P_{kr} h_{6-k, 6-r} \tag{4}$$

$$= [P_{42}h_{24} + P_{43}h_{23} + P_{44}h_{22} + P_{45}h_{21} + P_{46}h_{20}$$

$$+ P_{52}h_{14} + P_{53}h_{13} + P_{54}h_{12} + P_{55}h_{11} + P_{56}h_{10}$$

$$+ P_{62}h_{04} + P_{63}h_{03} + P_{64}h_{02} + P_{65}h_{01} + P_{66}h_{00}]$$

However, as may be seen from the preceding, the computation for $g_{66}$ requires 15 multiplications and 14 additions. This may be generalized for an M by N point filter as follows:

No. of multiplications required = $MN$ (5)

No. of additions required = $MN - 1$

If the desired unit pulse response (point spread function) of the filter is separable into the product of two one-dimensional responses, then the filter unit pulse response can be expressed as:

$$h_{mn} = (hy)_m \cdot (hx)_n \tag{6}$$

where $(Hy)_m$ and $(hx)_n$ are one-dimensional responses in the y and x directions respectively. Applying the relationship (6) to the specific example previously cited for a 3 by 5 filter, the calculation of $g_{66}$ given by equation (4) becomes:

$$g_{66} = (hy)_2[P_{42}(hx)_4 + P_{43}(hx)_3 + P_{44}(hx)_2 + P_{45}(hx)_1 + \tag{7}$$

$$P_{46}(hx)_0] + (hy)_1[P_{52}(hx)_4 + P_{53}(hx)_3 + P_{54}(hx)_2 +$$

$$P_{55}(hx)_1 + P_{56}(hx)_0] + (hy)_0[P_{62}(hx)_4 + P_{63}(hx)_3 +$$

$$P_{64}(hx)_2 + P_{65}(hx)_1 + P_{66}(hx)_0]$$

From (7), it is seen that only 8 multiplications are required, as opposed to 15 multiplications in (4). Also, $g_{66}$ can be computed by performing three successive one-dimensional convolutions of five steps each in the horizontal, or X direction, followed by a single one-dimensional convolution in the Y direction. Significantly, the 5 point convolution in the X direction can be saved and used for a subsequent calculation performed one scan line later.

As a result, the number of multiplications and additions required for each output (after the computations are completed for the first row of output pixels) become: 5 multiplications in the X direction plus 3 multiplications in the Y direction for a total of 8 multiplications, with 4 additions in the X direction plus 2 additions in the Y direction for a total of 6 additions.

Generalizing the above to a M by N point FIR filter would give the following number of operations per output pixel:

No. of multiplications required = $M + N$ (8)

No. of additions required = $(M - 1) + (N - 1)$

The number of operations required is seen from equation 8 to be considerably less than the MN multiplications and $MN - 1$ additions heretofore required. The "savings", which become greater as M and N increase in value, can be realized either in the form of reducing the real time burden on a computer performing the required calculations, or by reducing the number and/or speed of circuits required in special purpose hardware implementations.

A further simplification can be made where the two one-dimensional filters used are symmetric (a condition usually satisfied in practice) such that:

$$(hy)_2 = (hy)_0 \tag{9}$$

$$(hx)_4 = (hx)_0$$

$$(hx)_3 = (hx)_1$$

By using the above conditions, three more multiplications can be eliminated as follows:

$$g_{66} = (hy)_0[(P_{42} + P_{46})(hx)_0 + (P_{43} + P_{45})(hx)_1 + (P_{44})(hx)_2]$$

$$+ (hy)_1[(P_{52} + P_{56})(hx)_0 + (P_{53} + P_{55})(hx)_1 + P_{54})(hx)_2]$$

$$+ (hy)_0[(P_{62} + P_{66})(hx)_0 + (P_{53} + P_{65})(hx)_1 + (P_{64})(hx)_2]$$

The number of 2 element additions does not change.

A further simplification can be achieved by normalizing the central response values $(hx)_2$ and $(hy)_1$ to unity (or some other convenient power of 2), and thereby eliminating 2 more multiplier stages.

This invention relates to a multi-dimensional finite impulse response filter for processing a stream of image pixels comprising in combination: a first row of image signal buffers coupled in series with one another for receiving the stream of image pixels; a first summing circuit; first image pixel buses tapped to the inputs of the buffers in the first buffer row and the output of the last buffer in the first buffer row for conducting image pixels to the input of the first summing circuit; first multiplier means for multiplying image pixels transmitted by the first image signal buses by preset individual multiplier factors; a second row of image buffers coupled in series with one another, the totalized output of the first summing circuit being input to the first buffer in the second buffer row; a second summing circuit; second image pixel buses tapped to the input of the second buffer row and the outputs of the buffers comprising the second buffer row for conducting image pixels to the input of the second summing circuit; and second multiplier means for multiplying image pixels transmitted by the second image pixel buses by a preset multiplication factor whereby to provide filtered image pixels at the second summing circuit output.

Other objects and advantages will be apparent from the ensuing description and drawings in which:

FIG. 3 is a schematic view of a second FIR filter embodiment in which the filter is symmetric and has a center response point of unity; and FIG. 4 is a schematic view of a third FIR filter embodiment in which the filtering order of FIG. 3 is reversed.

Figure 1:
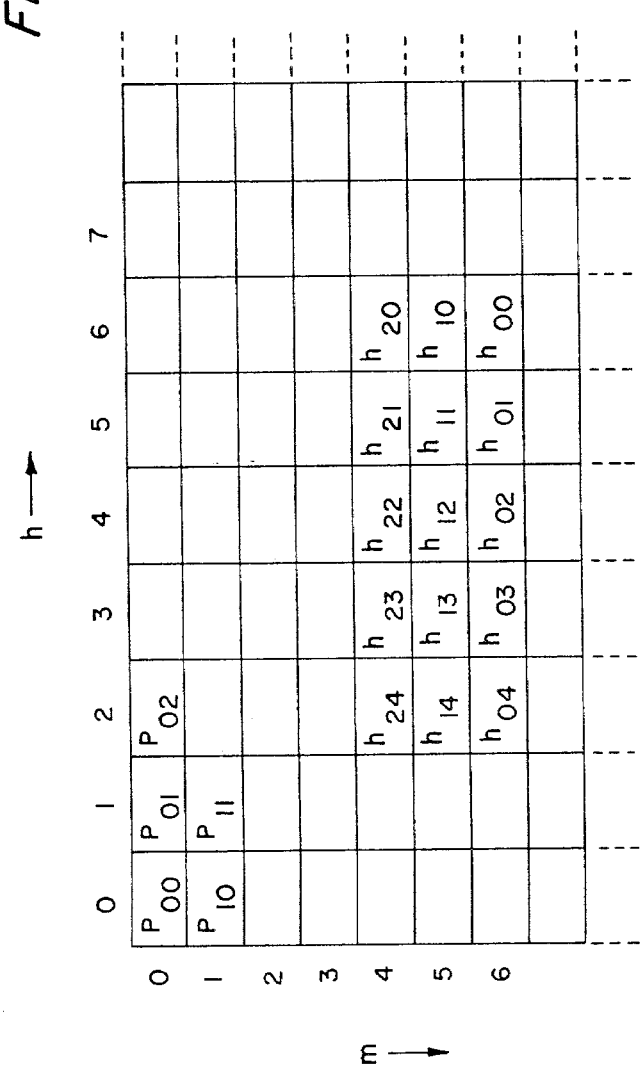
FIG. 1 is a graphical representation of a 3×5 image pixel filter.

There is defined herein an efficient spatial convolution approach for performing two-dimensional Finite Impulse Response (FIR herein) filtering when the desired filter response is separable, i.e. when the response can be expressed as the product of two one-dimensional responses in the X and Y directions respectively. This is a condition often encountered in practical image processing filters. Ordinarily, M point by N point FIR filters implemented by standard two-dimensional convolution methods require (MN) multiplications and (MN−1) additions per image pixel output. The filter of the present invention, in cases where the filter is separable, requires only (M+N) multiplications and (M+N−2) additions per image pixel output. As an example, in the 3 by 5 filter shown in FIG. 1, the number of multiplications is reduced from 15 to 8, and the number of additions reduced from 14 to 6.

A further reduction in the number of multiplications may be effected by taking advantage of symmetry properties of the filter and by normalizing the central response point of the filter to unity, as will appear. When applied to the 3 by 5 filter of FIG. 1, the number of multiplicatons undergo a further drop to 5 for the separable filter case. There is no change in the number of additions.

Figure 2:
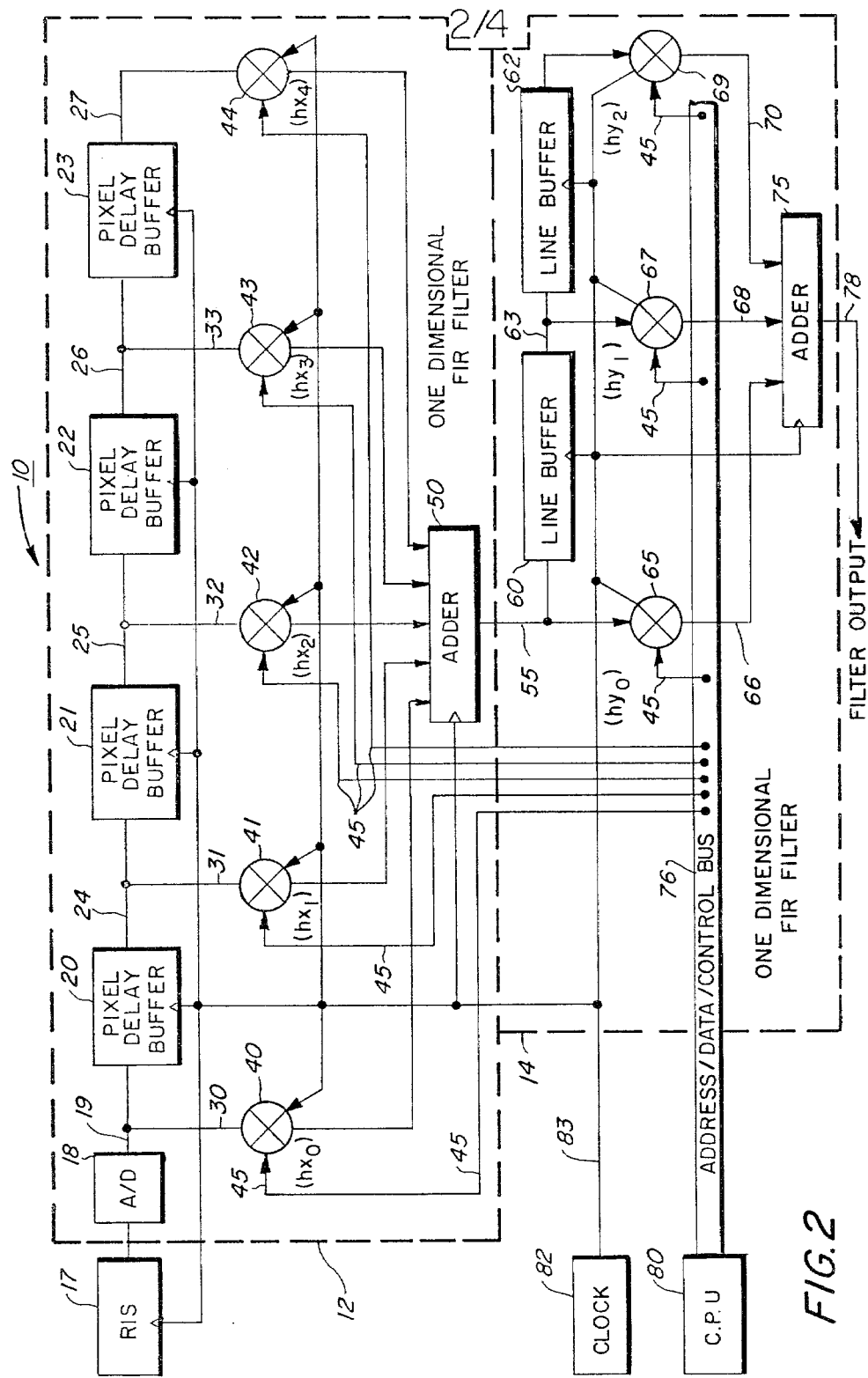
FIG. 2 is a schematic view of the separable Finite Impulse Response (FIR) filter of the present invention.

Referring now to FIG. 2, a separable FIR filter 10 incorporating the principles of the present invention is thereshown. Filter 10, which is comprised of one dimensional X and Y filter sections 12, 14 respectively, comprises a 3 by 5 matrix filter as exemplified in FIG. 1 and discussed hereinbelow. Other filter matrix sizes may, however, be contemplated.

X filter section 12 has image pixels input thereto from a suitable source 17 through bus 19 and includes a series of one-pixel delay buffers 20, 21, 22, 23. Buffers 20, 21, 22, 23 are connected in series by serial buffer buses 24, 25, 26, respectively, with input bus 19 coupled to the input port of the first buffer 20. A buffer output bus 27 is coupled to the output port of buffer 23.

Image pixel source 17 may comprise any suitable on-line or off-line source of image pixels such as a raster input scanner, communication bus, memory, computer, etc. An A/D converter 18 is provided to digitize the incoming video signals prior to processing by filter 10. It is understood that the number of bits required is a function of the resolution desired and is typically 6–8 bits.

Image pixel input bus 19, serial buffer buses 24, 25, 26, are coupled through buses 30, 31, 32, 33, buffer output bus 27 and Multipliers 40, 41, 42, 43, 44 to Adder 50. Multipliers 40, 41, 42, 43, 44 serve to multiply the image pixels in buses 30, 31, 32, 33, 27 by preset filter factors $(hx)_0$, $(hx)_1$, $(hx)_2$, etc. input to Multipliers 40, 41, 42, 43, 44 through control buses 45. The processed image pixels output by Multipliers 40, 41, 42, 43, 44 are summed by Adder 50 to provide composite one-dimensional (i.e. X) filtered image pixels.

Processed image pixels from Adder 50 of X-dimensional filter section 12 are output to bus 55 and Y-dimensional filter section 14. Filter section 14 includes a pair of line buffers 60, 62, coupled in series by serial buffer bus 63. Image pixels from filter section 12 in bus 55 are input through Multiplier 65 and bus 66 to one input of Adder 75. Corresponding image pixels from adjoining image lines held in buffers 60, 62 are input to additional inputs of Adder 75 through Multipliers 67, 69 and buses 68, 70 respectively.

Multipliers 65, 67, 69 serve to multiply both the current line of image pixels being processed as well as two adjoining lines of image pixels by preset filter factors $(hy)_0$, $(hy)_1$, and $(hy)_2$ input to Multipliers 65, 67, 69 through contorl buses 45. Following processing by Multipliers 65, 67, 69, the image pixels are summed by Adder 75 to complete the second dimensional (i.e. Y) filter processing. The filtered image pixels are discharged to output bus 78.

Filter factors $(hx)_0$, $(hx)_1$, etc. and $(hy)_0$, $(hy)_1$, $(hy)_2$. may be derived from any suitable source exemplified herein by computer 80. Computer Address/Data/Control bus 76 is tapped by control buses 45 to provide the appropriate filter factor to Multipliers 40, 41, 42, 43, 44, 65, 67, 69. A suitable pixel clock 82 serves as a source of clock pulses for driving filter 10. Clock distribution bus 83 provides clock pulses to buffers 20, 21, 22, 23, 60 62; Multipliers 40, 41, 42, 43, 44, 65, 67, 69; and Adders 50, 75 of filter 10.

In operation, the stream of image pixels input to filter 10 are clocked through pixel delay buffers 20, 21, 22, 23. On each clock pulse, the pixel output of buffers 20, 21, 22, 23 and the instantaneous image pixel in input bus 19 are processed by Multipliers 40, 41, 42, 43, 44, and the results summed in adder 50 to provide filtering along the X axis. In the example discussed, filtering is accomplished over a span of 5 image pixels. The partially filtered pixels are output by X filter section 12 to Y filter section 14 where the individual pixels, together with the corresponding pixels from adjoining scan line output by buffers 60, 62, are simultaneously processed by Multipliers 65, 67, 69 and summed by Adder 75 to complete the filtering process.

As will be understood, at startup and termination of processing, buffers 20, 21, 22, 23, 60, 62 are set to an arbitrary image pixel value.

In the embodiment shown in FIG. 3, the central response values $(hx)_2$ and $(hy)_1$ are normalized to unity, eliminating additional Multiplier stages as described heretofore. Referring to FIG. 3, where like numbers refer to like parts, input bus 19 is tapped and incoming image pixels are fed through bus 101 to one input of Adder 100 of one-dimensional filter section 12. The output bus 27 of the last buffer 23 in the buffer series is coupled to a second input of Adder 100. The output of delay buffers 20, 22, are input through buses 105, 106 of the inputs of Adder 108. The output of Adders 100, 108 are processed by Multipliers 110, 112 and fed through buses 113, 114 to the inputs of Adder 115. The output of delay buffer 21 is coupled directly to an input of Adder 115 by bus 116.

Processed image pixels from X filter section 12 are input through bus 120 to one input of scan line buffer 122 and to an input of Adder 125. A second scan line buffer 123 is coupled to the output of buffer 122 by serial buffer bus 126. The output of buffer 123 is coupled to a second input of Adder 125 through bus 130. The output of Adder 125 is coupled through Multiplier 135 and bus 136 to one input of Adder 140. Bus 141 couples the output of line buffer 122 directly to a second input of Adder 140. Filtered image pixels are discharged to output bus 145. Filter factors and clock signals are derived from suitable sources such as computer 80, and pixel clock 82 as described heretofore.

Operation of the FIG. 3 embodiment filter is similar to that described above in connection with FIG. 2 with input image pixels and image pixels output by buffer 23 being summed by Adder 100 while the delayed image pixel output of buffers 20, 22 are summed by Adder 108. The summed pixels from Adders 100, 108 are processed by multipliers 110, 112 and summed together with the unitary pixel from delay buffer 21 by Adder 115.

The partially processed image pixels are thereafter summed with the corresponding signal from the second comparison line output of scan line buffer 123 and the result processed by Multiplier 135. The processed pixels from Multiplier 135 are summed together with the corresponding pixel from the first scan line output of buffer 122 to provide the filtered output.

In the embodiment shown in FIG. 4 where like numbers refer to like parts, image pixels from source 17 are input through bus 19 to line delay buffer 200 and via bus 202 to one input of Adder 205. A second line delay buffer 207 is provided, serial buffer bus 208 coupling the output of line buffer 200 to the input of line buffer 207. The output of line buffer 207 is coupled by bus 210 to a second input of Adder 205.

The output of Adder 205 is coupled through Multiplier 212 and bus 213 to one input of Adder 215. Bus 216 is tapped into serial buffer bus 208, bus 216 being coupled to a second input of Adder 215.

The output of Adder 215 is coupled by bus 220 to X-dimensional filter section 12' and the input to the first pixel delay buffer 221 of buffer series 221, 222, 223, 224. Bus 220 additionally feeds image pixels to one input of Adder 240. The output of buffer 224 is coupled by bus 230 to a second input of Adder 240. The outputs of delay buffers 221, 223, are coupled by buses 232, 233 to the inputs of Adder 242.

The outputs of adders 240, 242, are coupled through Multipliers 245, 246 and buses 248, 249 to the inputs of Adder 250. Bus 235 couples the output side of delay buffer 222 to an input of Adder 250. Filtered pixels from Adder 250 are discharged through output bus 252.

As described previously, the multiplication factor of Multipliers 212, 245, 246 are input from suitable means such as computer 80. Pixel clock 82 provides operating clock signals for buffers 200, 207, 221, 222, 223, 224; Adders 205, 215, 240, 242, 250; and Multipliers 212, 245, 246.

In the FIG. 4 embodiment, first stage filtering is effected in the Y-dimension with the image pixels summed with the corresponding image pixel from the second line output of buffer 207 by Adder 205. The output of Adder 205 is multiplied by a preset filter factor by Multiplier 212 and added together with the pixel output of the first line output from buffer 200 by Adder 215. The partially processed image pixels are thereafter processed in the X-direction with addition by Adders 240, 242, filter multiplication by Multipliers 245, 246 and summing by Adder 250.

Adders such as Adder 50 (FIG. 2) may comprise any suitable commercially available summing circuit such as a No. SN74S283 Adder manufactured by Texas Instruments, Inc. Multipliers such as Multiplier 40 (FIG. 2) may comprise any suitable commercially available multiplying circuit such as No. MPY-16HJ Multiplier manufactured by T.R.W.-LSI Products. A/D converter 18 may for example, comprise a No. TDC-1007J Converter made by TRW-LSI Products, or any other suitable converter.

While the invention has been described with reference to the structure disclosed, it is not confined to the details set forth, but is intended to cover such modifications or changes as may come within the scope of the following claims:

I claim:

1. A two-dimensional finite impulse response filter for filtering image pixels with minimal processing steps, comprising, in combination:
    (a) first and second filter sections in series for filtering image pixels in the Y and X directions in succession,
    (b) said first filter section including
        (1) at least one pixel line storage buffer;
        (2) adder means;
        (3) buses coupling the input and output of said line storage buffer to said adder means; and
        (4) multiplier means in at least one of said buses for multiplying pixels in said bus by a predetermined filter factor;
    (c) said second filter section receiving partially filtered pixels from said first filter section and including
        (1) plural one pixel delay buffers in series;

(2) second adder means;
(3) second buses coupling the input and outputs of said one pixel delay buffers to said second adder means; and
(4) second multiplier means in at least one of said second buses for multiplying pixels in said second bus by a predetermined filter factor.

2. The filter according to claim 1 including multiplier means in each of said pixel buses.

3. The filter according to claim 1 in which said first filter section includes at least two pixel line storage buffers in series,
said buses coupling the input of the first of said line storage buffers in said series and the outputs of said series of line storage buffers to said adder means.

4. A multi-dimensional finite impulse response filter having reduced image signal processing steps, comprising in combination:
(a) a Y-dimension filter section including:
  (1) a series of line buffers for temporarily holding successive lines of image signals for filtering purposes, said image signals being input to the first buffer in said buffer series and transmitted through successive ones of the buffers in said buffer series to the output of the last buffer in said buffer series;
  (2) adder means for summing signals input thereto;
  (3) a first bus group coupling the inputs of each buffer in said buffer series and the output of the last buffer in said buffer to said adder means input; and
  (4) multiplier means in at least one of the buses comprising said first bus group for multiplying image signals as said signals are input to said adder means by a predetermined filter factor; and
(b) a X-dimension filter section including:
  (1) a series of one pixel delay buffers for temporarily holding partially filtered image signals comprising a portion of a line as said partially filtered image signals are output by said first filter section for filtering purposes, said image signals being input to the first of said one pixel delay buffers and transmitted through successive ones of the said one pixel delay buffers to the output of the last buffer in said series;
  (2) second adder means for summing signals input thereto;
  (3) a second bus group coupling the inputs of each of said one pixel delay buffers and the output of the last buffer in said series to said second adder means input; and
  (4) second multiplier means in at least one of the buses comprising said second bus group for multiplying image signals as said signals are input to said second adder means by a predetermined filter factor.

* * * * *